(12) United States Patent
Seok

(10) Patent No.: US 9,082,845 B1
(45) Date of Patent: Jul. 14, 2015

(54) SUPER JUNCTION FIELD EFFECT TRANSISTOR

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/231,516

(22) Filed: Mar. 31, 2014

(51) Int. Cl.
*H01L 29/78* (2006.01)
*H01L 29/06* (2006.01)
*H01L 29/40* (2006.01)
*H01L 29/49* (2006.01)
*H01L 29/66* (2006.01)
*H01L 21/02* (2006.01)

(52) U.S. Cl.
CPC ...... *H01L 29/7811* (2013.01); *H01L 21/02129* (2013.01); *H01L 29/0619* (2013.01); *H01L 29/0634* (2013.01); *H01L 29/402* (2013.01); *H01L 29/4916* (2013.01); *H01L 29/66712* (2013.01)

(58) Field of Classification Search
None
See application file for complete search history.

(56) References Cited

U.S. PATENT DOCUMENTS

| | | | |
|---|---|---|---|
| 2010/0163846 A1* | 7/2010 | Yilmaz et al. | 257/24 |
| 2012/0273884 A1* | 11/2012 | Yedinak et al. | 257/341 |
| 2014/0197476 A1* | 7/2014 | Shimatou | 257/329 |

OTHER PUBLICATIONS

Wolf and Tauber, Silicon Processing for the VLSI Era, vol. 1, Process Technology, 2nd ed., Sunset Beach CA: Lattice Press, 2000, pp. 371-377.*

* cited by examiner

*Primary Examiner* — Erik Kielin
(74) *Attorney, Agent, or Firm* — Imperium Patent Works; T. Lester Wallace; Amir V. Adibi

(57) ABSTRACT

A split-body Super Junction FET is made using only seven masks. Thin oxide is disposed on an upper semiconductor surface of a super junction charge compensation region. A polysilicon gate is disposed on the thin oxide. An ILD (Inter-Layer Dielectric) layer is disposed on the upper surface of the thin oxide so that the ILD layer covers the polysilicon gate. A gate bus line metal structure and a field plate metal structure are disposed on the upper surface of the ILD. A portion of the upper surface of the ILD extends from the gate bus line metal, laterally over floating rings, and to the field plate metal. This portion of the upper surface of the ILD layer is substantially planar where the ILD layer passes over the floating rings. The field plate metal structure, a polysilicon feature, and a diffusion region together form a stepped depletion layer field plate structure.

19 Claims, 10 Drawing Sheets

SJ FIELD EFFECT TRANSISTOR STRUCTURE
(TOP-DOWN VIEW)

| MASK NUMBER | MASK NAME |
|---|---|
| 1 | DEEP TRENCH |
| 2 | POLY |
| 3 | P+ |
| 4 | N+ |
| 5 | CONTACT |
| 6 | METAL |
| 7 | PAD |

SJ FIELD EFFECT TRANSISTOR
7 MASK PROCESS

JFET IMPLANT DRIVE IN

MASK 1: DEEP TRENCH MASK,
THEN DEEP TRENCH ETCH

CROSS-SECTIONAL VIEW OF TWO
CELLS IN THE ACTIVE AREA
(FINAL STRUCTURE)

US 9,082,845 B1

SUPER JUNCTION FIELD EFFECT TRANSISTOR

TECHNICAL FIELD

The described embodiments relate generally to Super Junction field effect transistors and methods for making Super Junction field effect transistors.

BACKGROUND INFORMATION

To make a conventional power N-channel field effect transistor that meets a particular breakdown voltage requirement, the concentration of N type dopants in the N type drift region of the transistor must be adequately low. But making the concentration of N type dopants in the N type drift region low results in an undesirably high resistivity of the semiconductor material in the drift region. For the conventional power N-channel field effect transistor to have a required current rating ($R_{DS(ON)}$ is not higher than a specified value when a given current is flowing through the transistor), the die area of the conventional power N-channel field effect transistor has to be made correspondingly large in order to achieve the required low drain-to-source resistance $R_{DS(ON)}$ of the overall transistor device. If super junction techniques are employed, however, then an N-channel field effect transistor can be made whose drift region includes what is called a "charge compensation region". For the same required breakdown voltage, and for the same required current rating, the die of the Super Junction N-channel field effect transistor can be made smaller than if a conventional transistor architecture were employed. Due to the smaller die size, a power transistor that meets the breakdown voltage requirement and the current rating requirement can be made less expensively using the super junction techniques. Ways to improve such Super Junction field effect transistors are desired.

SUMMARY

A split-body Super Junction Field Effect Transistor (FET) device includes a charge compensation region disposed on a substrate of monocrystalline semiconductor material. The charge compensation region includes a plurality of columns of P– type epitaxial semiconductor material within a region of N– type epitaxial semiconductor material. The column may, for example, be stripes or cylindrical columns organized concentrically with respect to one another. The alternating P– type and N– type semiconductor material makes the charge compensation region. The concentration N type dopants in the upper portion of the N– type material of the charge compensation region is made higher, therefore forming an N– type JFET layer at the top of the charge compensation region. A thin oxide layer is disposed on an upper semiconductor surface of the JFET layer. A plurality of P type edge termination floating rings extend from the upper semiconductor surface down into the semiconductor material toward the substrate. An N++ type polysilicon gate structure is disposed on an upper surface of the thin oxide layer. An ILD (Inter-Layer Dielectric) layer is disposed on the upper surface of the thin oxide layer so that the ILD layer covers the polysilicon gate structure. A gate bus line metal structure is disposed on an upper surface of the ILD layer. Adjacent the peripheral edge of the die, a field plate metal structure is disposed at least in part on the upper surface of the ILD layer. Accordingly, a portion of the upper surface of the ILD extends from the gate bus line metal structure, laterally over the edge termination floating rings, and out to the field plate metal structure adjacent the outer edge of the die. In accordance with a first novel aspect, this portion of the upper surface of the ILD layer is substantially planar where the ILD layer passes over the floating rings, and no P type dopants for the floating rings are implanted through the ILD layer or through holes in the ILD layer. A passivation layer then covers the gate bus line structure and covers the field plate metal structure. There are no polysilicon features anywhere between the gate bus line metal structure and the field plate metal structure.

The active area of the die can be considered to be organized as a matrix of identical "cells". In accordance with a second novel aspect, within a cell an amount of the P– type material of the P-type column extends up to the semiconductor-to-metal boundary in the center of the P-type column where the P– type column meets the upper semiconductor-to-metal boundary. When the cell is considered in cross-section, at the semiconductor-to-metal boundary, there is a P body region on one side (an N+ type source region extends into this P body region), and a P body region on the other side (an N+ type source region extends into this P body region), where the two P body regions are separated from one another (or are "split") due to the amount of the P– type semiconductor material of the P– type column structure extending up to the semiconductor-to-metal boundary.

In a third novel aspect, at the periphery of the die there is a stepped depletion layer field plate structure. This stepped depletion layer field plate structure involves the field plate metal structure, an N++ type polysilicon field plate structure, and an N+ type field plate diffusion region. The field plate metal structure couples (electrically couples) the N++ type polysilicon field plate structure and the N+ type field plate diffusion region together. The N++ type polysilicon field plate structure is deposited at the same time that the polysilicon gate structures of the overall device are deposited. The N+ type field plate diffusion region is formed at the same time that the N+ type source regions of the overall device are formed.

The novel split-body Super Junction FET can be made using a novel semiconductor fabrication process that employs no more than seven masks: 1) a deep trench mask used to form the deep trenches of the charge compensation layer, 2) a polysilicon mask used to form a polysilicon layer into polysilicon features, 3) a P+ implant mask used to form P type body regions, 4) an N+ implant mask used to form N+ type diffusion regions including source regions and a field plate diffusion region, 5) a contact mask used to make contacts where metal will contact the semiconductor surface, 6) a metal mask used to form a layer of topside metal into a gate terminal and gate bus line and into a source terminal and into a field plate metal structure, and 7) a pad mask used to open pad areas through passivation to form contact pad areas (such as a gate pad and a source pad) to allow access to the source and gate terminals.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the text and drawings, the dopant labels N++, N+, N−, N, P+, P−, and P are only very loose general descriptions of relative dopant concentrations. A particular dopant label appearing in the text below has meaning within the local context of its usage. In the text and drawings, the term P type is sometimes used not as a description of a relative dopant concentration, but rather is used as a broad term to denote semiconductor material that may be P− type, or may be P type, or may be P+ type, or that may include sub-regions of various P type dopant concentrations.

Figures 1, 2:
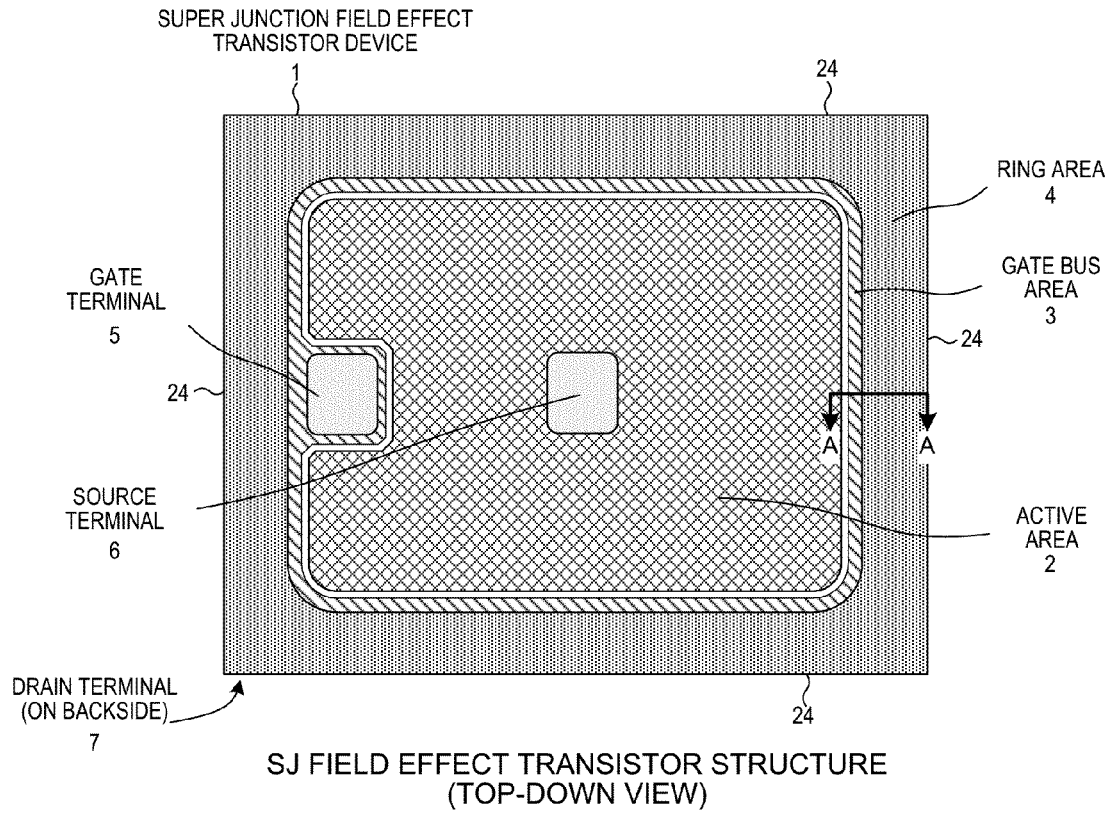
FIG. 1 is a top-down diagram of a Super Junction FET device in accordance with one novel aspect.
FIG. 2 is a table that sets forth mask steps of a novel seven mask process usable to manufacture the Super Junction FET device of FIG. 1.

FIG. 1 is a top-down diagram of a Super Junction FET (Field Effect Transistor) device die 1 in accordance with one novel aspect. Such a Super Junction FET device 1 is also loosely referred to as a Super Junction MOSFET (Metal Oxide Semiconductor Field Effect Transistor), even though the structure is understood not to have a metal gate. As viewed from the top-down perspective of FIG. 1, the Super Junction FET device 1 has an active area 2, that is surrounded by a gate bus area 3, that in turn is surrounded by a ring area 4. A passivation layer (not shown) covers the entire structure, but for an exposed gate terminal 5, and an exposed source terminal 6. The gate and source terminals in this case are parts of die that are not covered by passivation and that serve as bond pads. The entire backside of the die is a layer of metal that forms the drain terminal 7. Once the die has been manufactured, it is typically packaged into a package such as a standard TO-220 or TO-247 package so that the packaged device can then be soldered to a printed circuit board or otherwise used by an end user.

Figure 3A:
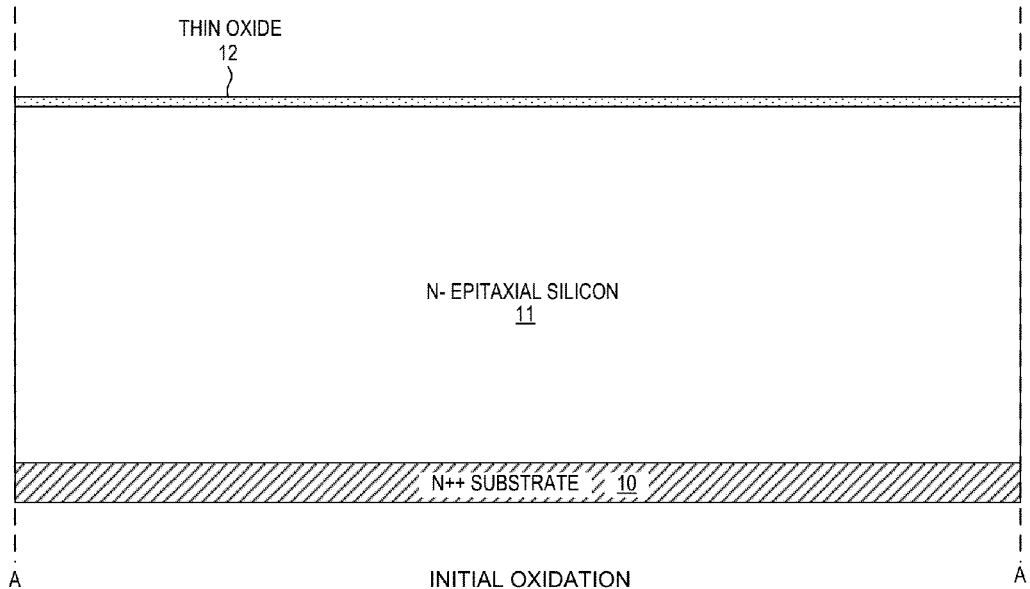
FIG. 3A illustrates an initial thin oxide oxidation step.

FIG. 2 is a table that sets forth the mask steps of a novel seven mask step process used to manufacture the Super Junction FET device 1 of FIG. 1. FIGS. 3A-3N are cross-sectional diagrams (taken along sectional line A-A in FIG. 1) that illustrate various steps in the process.

FIG. 3A illustrates an initial thin oxide oxidation step. Reference numeral 10 identifies a semiconductor substrate. In one example, the substrate 10 is N++ type monocrystalline bulk silicon material. In other example, the substrate 10 can include multiple layers. The substrate 10 is covered by an N− type layer 11 of epitaxial silicon that was grown on the substrate. In this oxidation step, the upper surface of the N− type epitaxial layer 11 is oxidized so that a thin layer 12 of thermal oxide covers the epitaxial layer 11. In the diagram, the relative thickness of the substrate 10 as compared to the other layers is shown to be much thinner that it actually is. The substrate 10 is shown as being relatively thin in this way in order to provide more area in the remainder of the diagram to show detail in other parts of the structure.

Figure 3B:
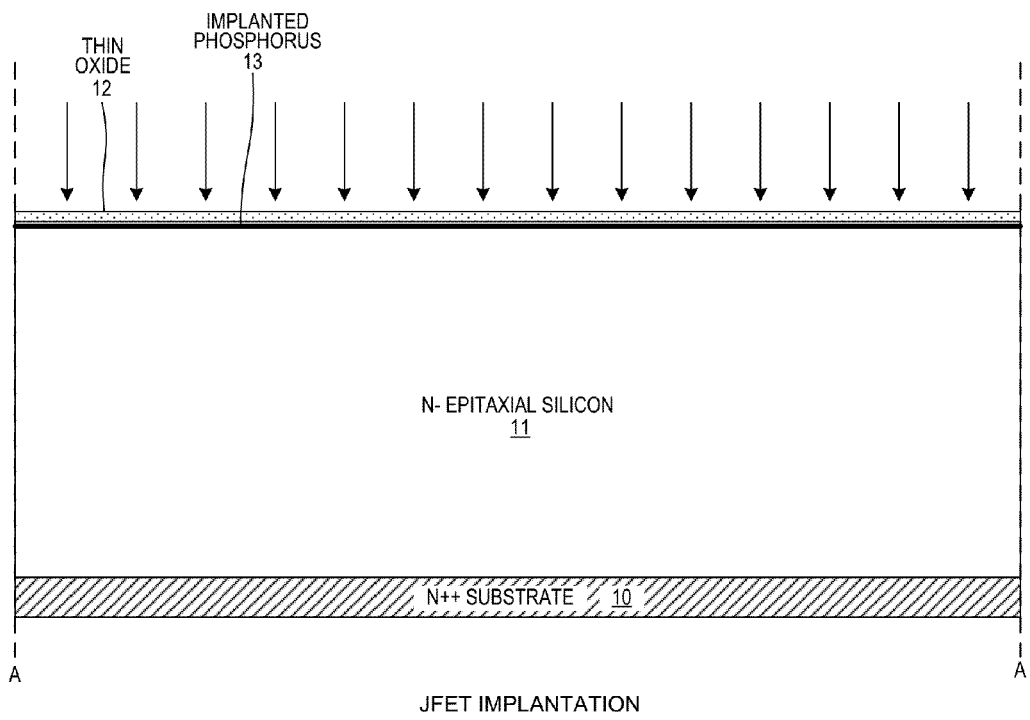
FIG. 3B illustrates a subsequent JFET implantation step.

FIG. 3B illustrates a subsequent JFET implantation step. Phosphorus is implanted through the thin oxide layer 12 to form a thin implanted N+ type layer 13 just underneath the thin oxide.

Figure 3C:
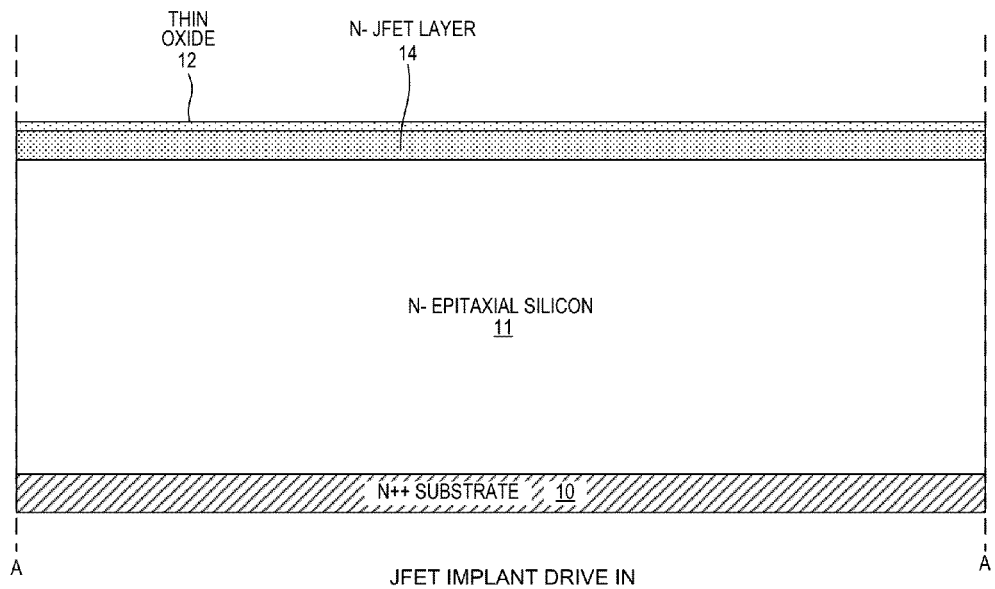
FIG. 3C illustrates a subsequent JFET implant drive in step.

FIG. 3C illustrates a subsequent JFET implant drive in step. The structure of FIG. 3B is heated to about 1150 degrees Celsius and maintained at this temperature for about two hours. This causes the phosphorous of the thin layer 13 to diffuse downward to form N− type JFET layer 14. Although both the epitaxial layer 11 and the JFET layer 14 are both labeled as being of N-type silicon, the JFET layer 14 is more highly doped than is the epitaxial layer. After drive in, the concentration of phosphorus dopants in the JFET layer gradually decreases with depth downward into the epitaxial layer. The illustrated delineation of the bottom boundary of JFET layer 14 in the drawings represents an N type dopant concentration that is basically the same as the N type dopant concentration of the epitaxial material 11.

Figure 3D:
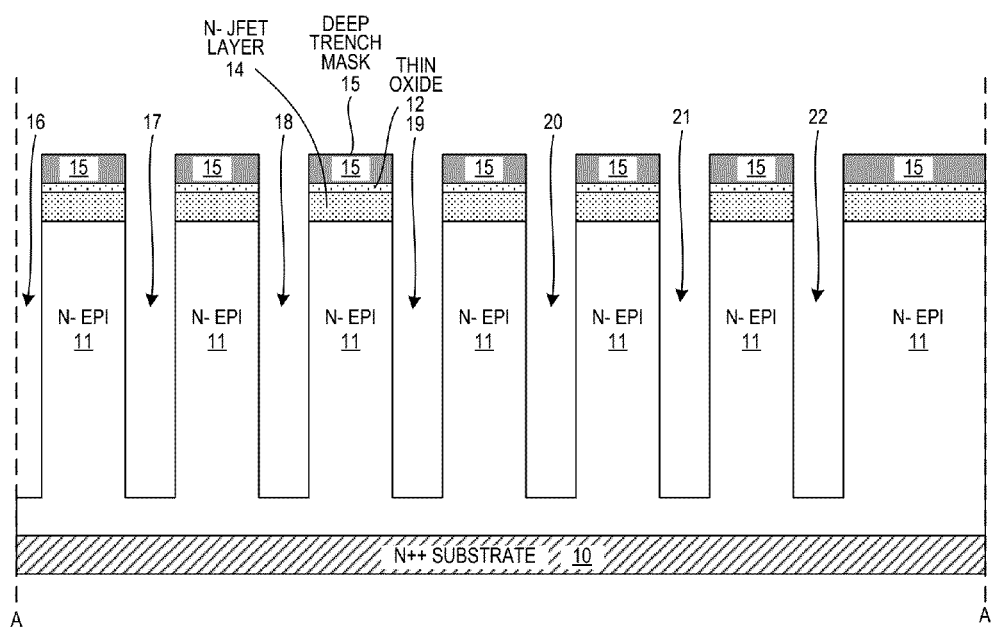
FIG. 3D illustrates a subsequent deep trench mask step, and a deep trench etch step.

FIG. 3D illustrates a subsequent deep trench etch step. A layer of photoresist is made to cover the structure of FIG. 3C, and the photoresist is exposed and patterned to form photoresist mask layer 15. This deep trench mask 15 is then used to etch a plurality of parallel-extending deep strip-shaped trenches 16-22 downward through the thin oxide layer 12 and through the JFET layer 14 and into the N− type epitaxial layer 11 as shown. In the illustrated example, the deep strip-shaped trenches extend parallel to one around the die so that the deep strip-shaped trenches are concentric with respect to one another when the die is viewed from a top-down perspective. The deep trenches are of a size and spacing as is known in the art to make a charge compensation region with an edge termination region that is suitable for a power Super Junction FET. The size of the trenches and the spacing between trenches in the ring area at the periphery 24 of the die may be different than in the central active area of the die.

Figure 3E:
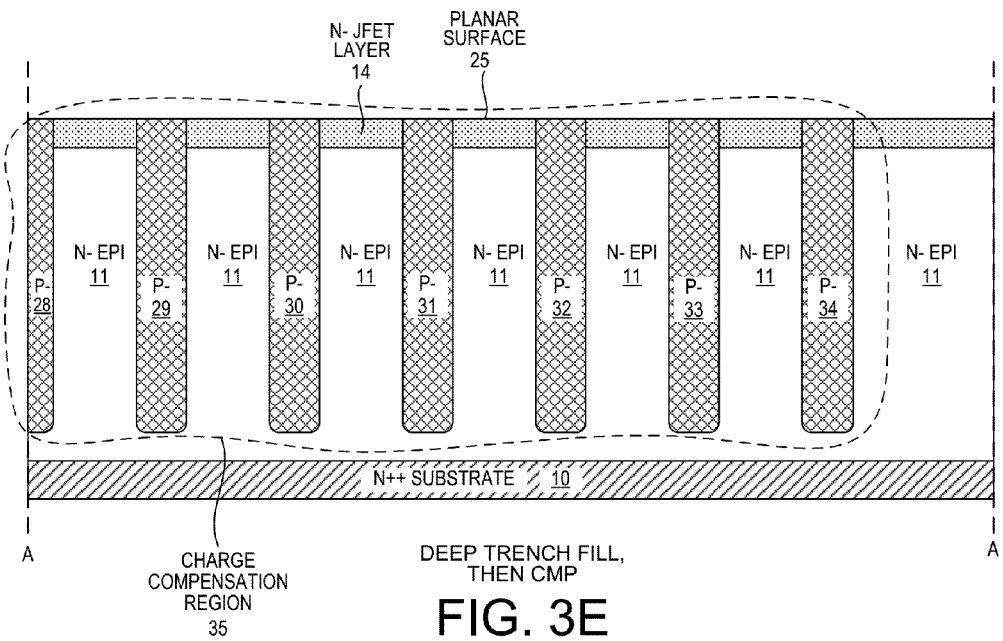
FIG. 3E illustrates a subsequent deep trench fill step in which the deep trenches are filled by P− type material, and the structure is planarized, to form a wafer having a charge compensation region.

FIG. 3E illustrates a subsequent deep trench fill step. The photoresist trench mask 15 is removed, and the remainder of the thin oxide layer 12 is removed, and the deep trenches are filled with epitaxially grown P− type silicon. After the growth of the epitaxial P− type silicon, the upper surface of the structure is planarized in a CMP (Chemical Mechanical Polishing) step to form planar surface 25. The resulting structure involves a concentric set of ring-shaped P− type cylindrical column 26-34. The P-type columns all extend parallel to one another. The P− type column structures are concentrically disposed with respect to each other with the die is viewed from the top-down perspective. The N− type material of epitaxial layer 11 and the P− type material of the concentric columns 26-34 together form a charge compensation region 35 of the Super Junction FET. The dashed line in FIG. 3E roughly identifies the charge compensation region 35. Features present in the processed wafer at this point, for example in scribe line areas, can be used as fiducial markers for alignment of subsequent mask steps. Consequently, a separate alignment mask step is not necessary to form alignment fiducial markers.

Figure 3F:
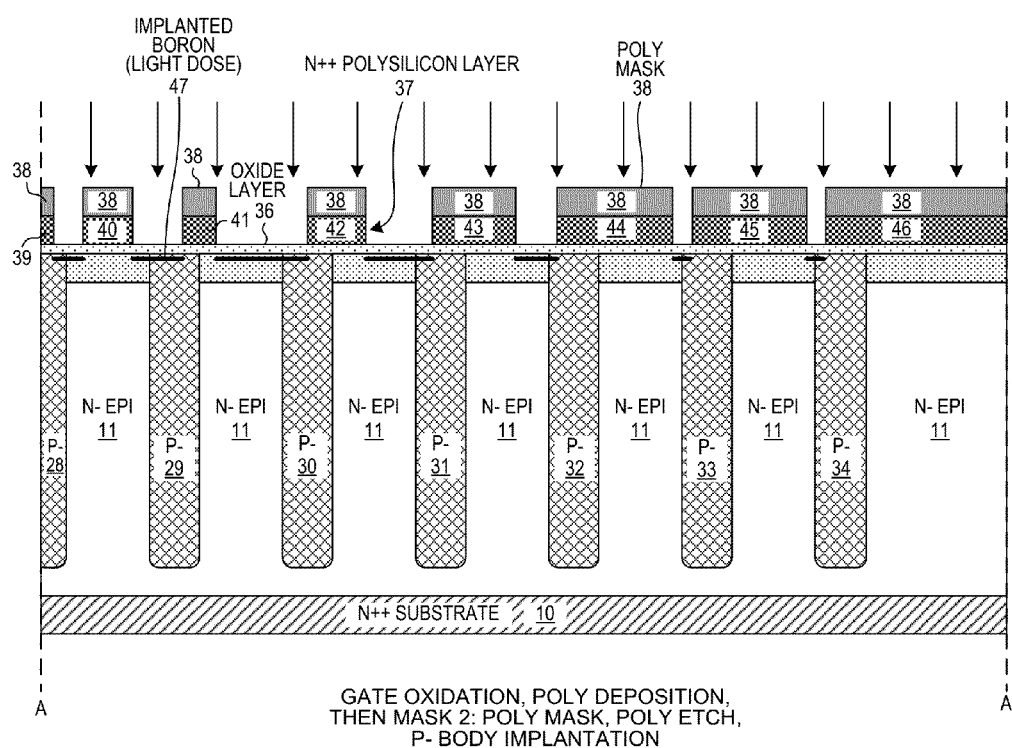
FIG. 3F illustrates a subsequent poly mask step in which the polysilicon layer is patterned, and then the poly mask and polysilicon is used as an implant mask for a light P− type P body implant step.

FIG. 3F illustrates a subsequent poly mask step. A thin thermal gate oxide layer 36 is grown on surface 25. A layer 37 of N++ type polysilicon is then deposited on the thin gate oxide layer 36. A layer of photoresist is made to cover the structure N++ type polysilicon layer, and the photoresist is exposed and patterned to form photoresist mask layer 38 for the N++ type polysilicon layer. This poly mask 38 is then used to etch away parts of the N++ type polysilicon layer, thereby forming N++ type polysilicon structures 39-46. N++ type polysilicon structure 40 will be a polysilicon gate structure. Part of N++ type polysilicon structure 46 will be a part of a stepped depletion layer field plate structure 84. Other structures, such as intermediate polysilicon structure 39, are provided to block P type implants so that a split P body will result as described in further detail below. After the N++ type polysilicon structures have been formed, a light P− type dose of boron is implanted using the poly mask and the polysilicon structures as a mask, thereby forming thin implanted P− type boron regions. Reference numeral 47 identifies one of these regions. Of importance, there is a thin implant-blocking polysilicon structure 39 that prevents boron from being implanted into a center portion of the P− type column 28. Such an implant blocking polysilicon feature is provided above the center of each P− type column.

Figure 3G:
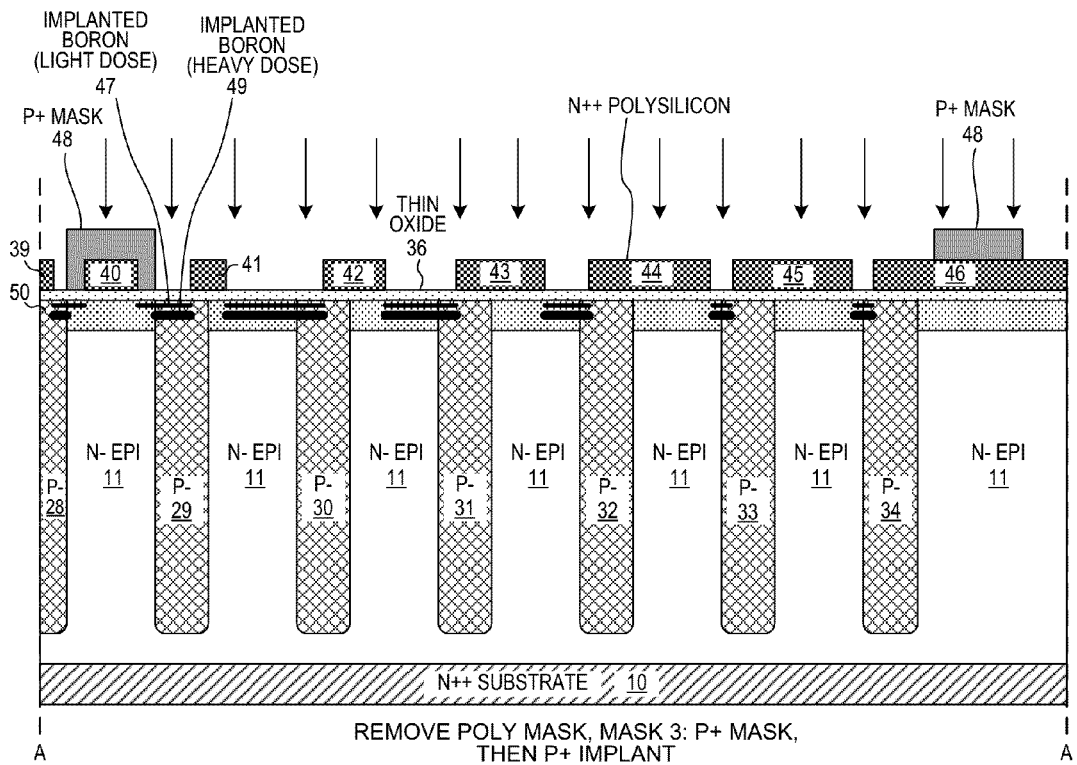
FIG. 3G illustrates a subsequent P+ mask, and P+ type P body implant step.

FIG. 3G illustrates a subsequent P+ implant step. The polymask 38 of FIG. 3F is removed, and then a layer of photoresist is made to cover the structure top of the structure, and the photoresist is exposed and patterned to form a P+ mask 48. After the P+ mask 48 has been formed, a heavy dose of boron is implanted using the P+ mask and the polysilicon structures as a mask, thereby forming thin implanted P+ type boron regions. Reference numeral 49 identifies one such heavily doped implanted regions. The boron dose of the P+ implant step may, for example, be ten times the boron dose of the earlier P− implant step. Due to the P+ mask 48, there is a region of the lighter boron dose closer to the edges of the polysilicon structure 40. As was the case with the P− type boron implant step of FIG. 3F, the thin implant-blocking polysilicon structure 39 prevents boron from being implanted into a center portion 50 of the P− type column 28. The polysilicon features 41-46 serve as implant blocking structures.

Figure 3H:
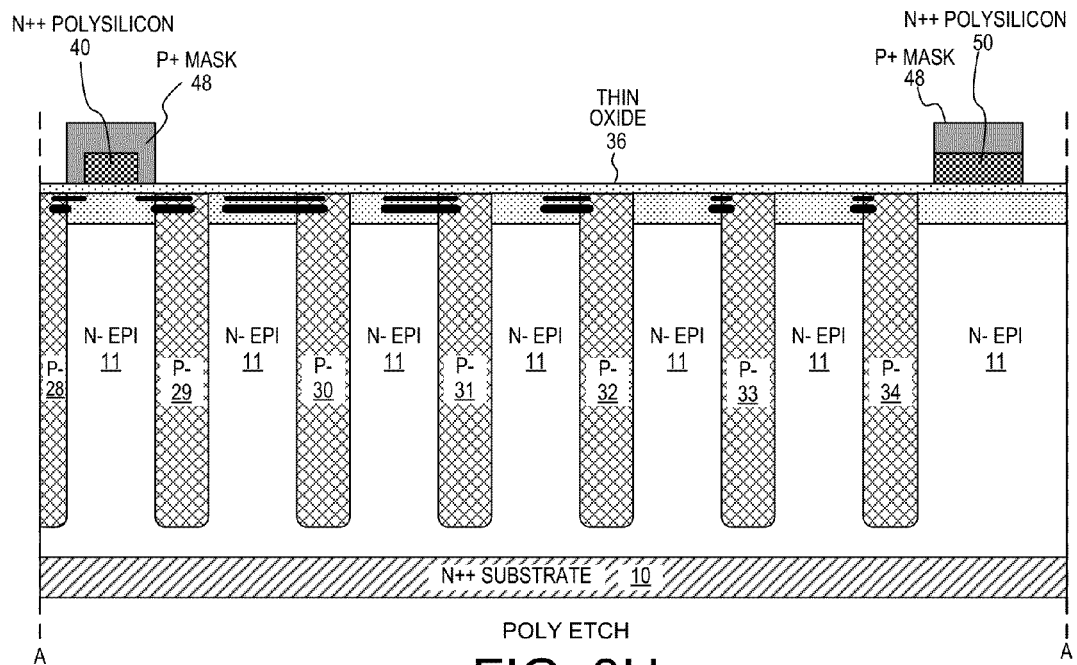
FIG. 3H illustrates a subsequent poly etching step.

FIG. 3H illustrates a subsequent poly etching step. A dry etch is used to remove all polysilicon from the top of the structure that is not covered and protected by photoresist of the P+ mask 48. As a result, a part of polysilicon feature 46 becomes a field plate N++ type polysilicon structure 50.

Figure 3I:
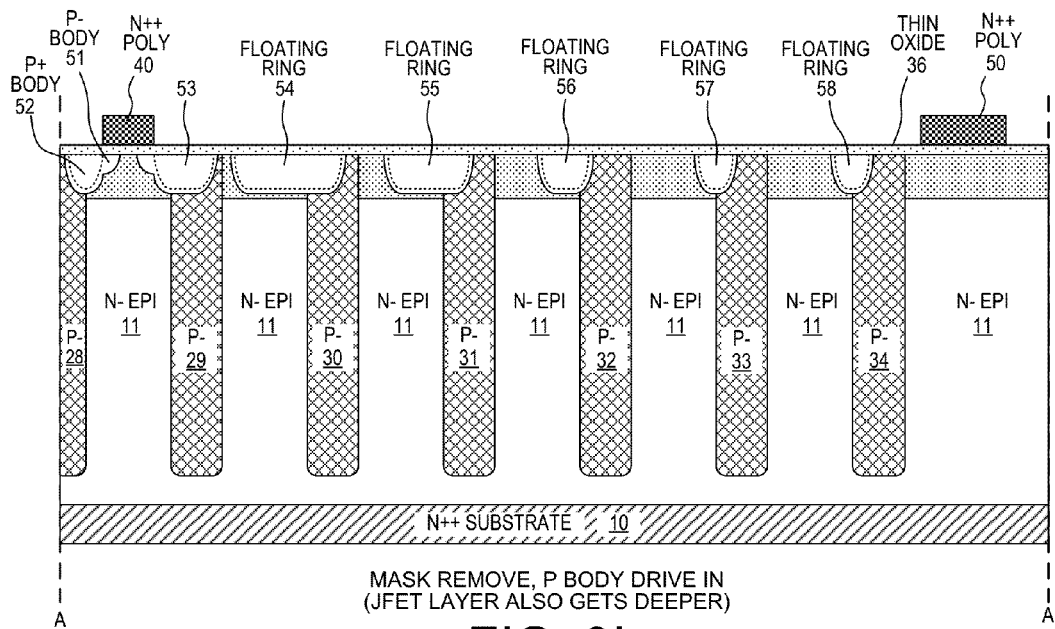
FIG. 3I illustrates a subsequent P body drive in step.

FIG. 3I illustrates a subsequent P body drive in step. The P+ photoresist mask is removed, and a thermal drive in step is performed that causes the implanted boron to diffuse to form the P body regions. Each P body region has a lightly doped outer P− type portion and a central relatively more heavily doped inner P+ type portion. For example, reference numeral 51 identifies an outer P− type portion. Reference numeral 52 identifies an inner P+ portion. The drive in step also causes floating rings 53-58 to be formed. During this drive in step, the boron of the JFET layer 14 is also driven in deeper.

Figure 3J:
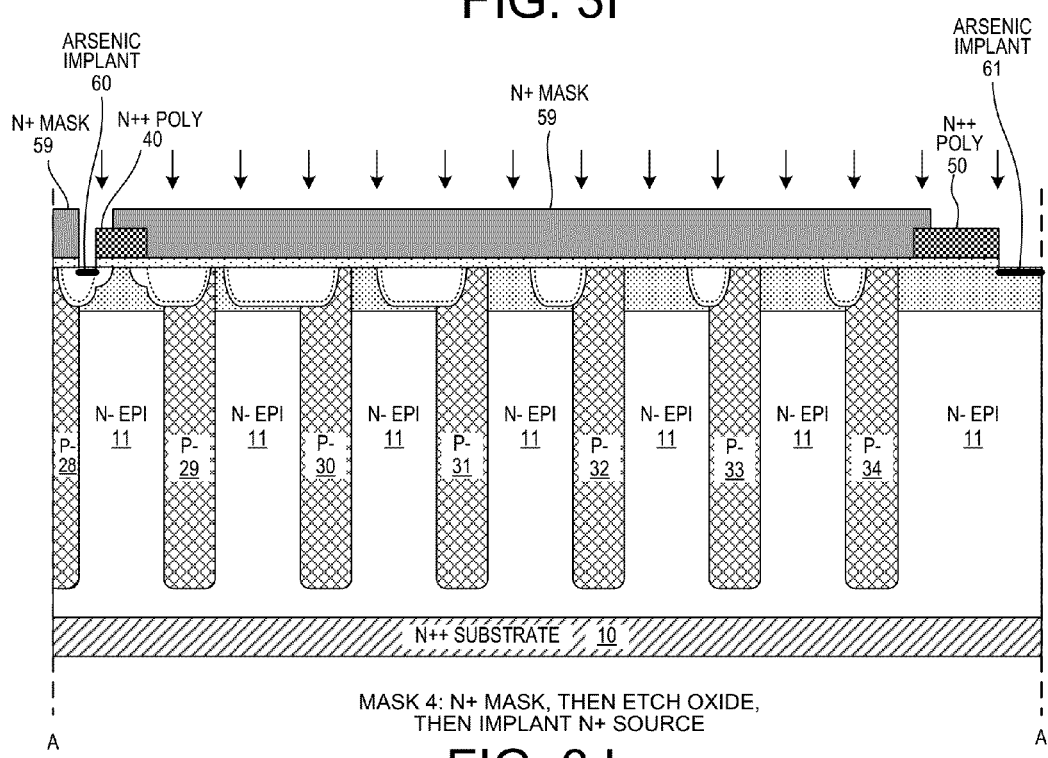
FIG. 3J illustrates a subsequent N+ type mask step, and N+ type source implant step.

FIG. 3J illustrates a subsequent source implant step. A layer of photoresist is applied over the structure, and the photoresist is exposed and patterned to form N+ photoresist mask layer 59. This N+ mask 59 is then used to etch away portions of the thin oxide layer 36 in regions to receive source implants. Arsenic is then implanted, using the N+ mask 59 and parts of the polysilicon structures 40 and 50 as a mask, thereby forming these implanted N+ type arsenic doped regions 60 and 61. Arsenic is used as the N type dopant because arsenic has a lower diffusion coefficient than does phosphorus. Consequently, the arsenic dopant stays in the position where it was implanted.

Figure 3K:
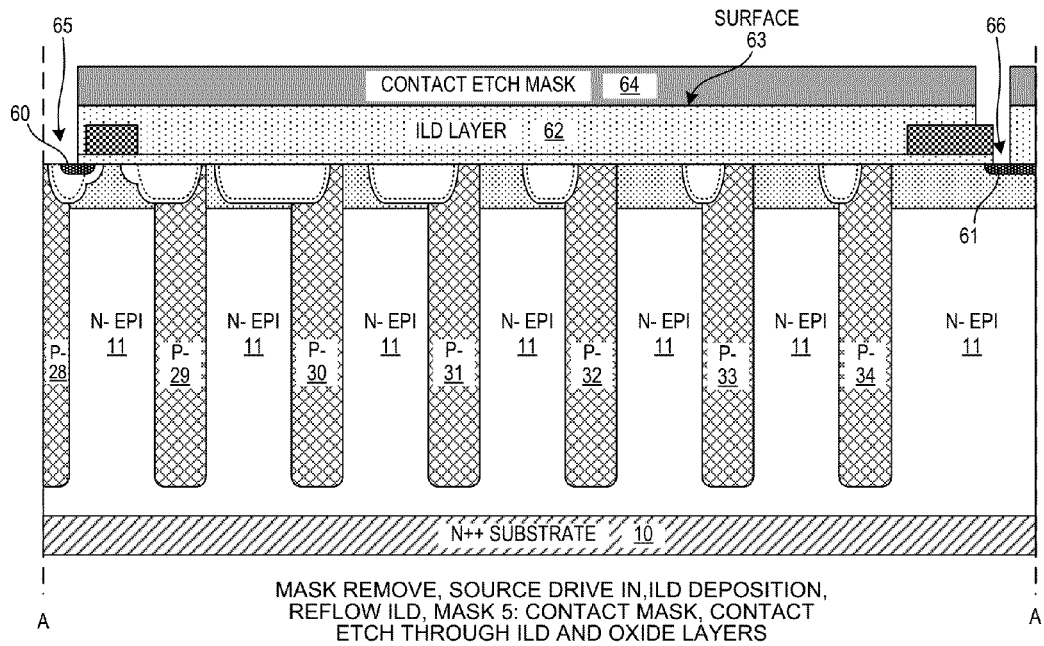
FIG. 3K illustrates a subsequent ILD formation step, contact mask step, and contact etch step.

FIG. 3K illustrates a subsequent ILD and contact etch step. The N+ mask 59 is removed, and in a thermal step (optional) the arsenic dopants are driven in, thereby forming N+ type source region 60 and N+ type field plate region 61. An ILD (InterLayer Dielectric) layer 62 is deposited, and its surface is then reflowed, so that the upper surface 63 of the ILD layer 62 is planar across the entire wafer. A layer of photoresist is applied over the ILD layer, and the photoresist is exposed and patterned to form a contact etch mask 64. This contact etch mask 64 is then used to etch contact regions 65 and 66 down through the ILD layer to the semiconductor surface. In some embodiments, the ILD layer 62 is a single layer of dielectric material. In other embodiments, the ILD layer 62 involves multiple layers of gap-filling dielectric material. In one preferred embodiment, the ILD layer 62 involves an initial LTO (Low Temperature Oxide) deposited oxide layer that is then covered with a BPSG (BoroPhosphoSilicate Glass) layer, the upper surface of which is then reflowed at 1000 degrees Celsius.

Figure 3L:
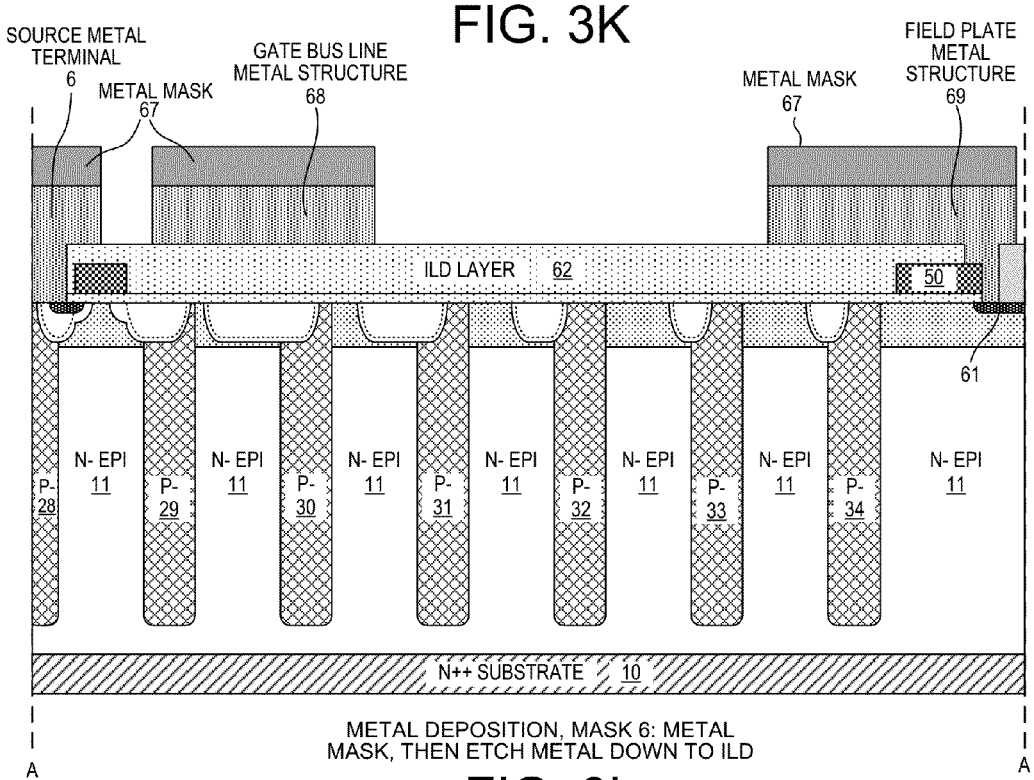
FIG. 3L illustrates a subsequent metal mask step, metal deposition step, and metal etch step.

FIG. 3L illustrates a subsequent metal mask and metal deposition step. The contact etch mask 64 is removed, and metal is deposited over the entire structure. This metal may involve multiple metal layers such as, for example, an initial thin layer of titanium that is covered by a thicker layer of aluminum. After the metal has been deposited, a photoresist mask 67 is formed. Photoresist mask 67 is used to etch the metal layer, thereby forming the source metal terminal 6, a gate bus line structure 68, and a depletion stopper field plate 69. In a third novel aspect, metal structure 69, N++ type polysilicon structure 50 and N+ type field plate diffusion region 61 together form a stepped depletion layer field plate structure 84. In the structure of FIG. 3N, the oxide layer 36 underneath the N++ type polysilicon structure 50 is less than 0.2 microns thick and this allows the N++ type polysilicon structure 50 to be used as part of a stepped depletion layer field plate structure.

Figure 3M:
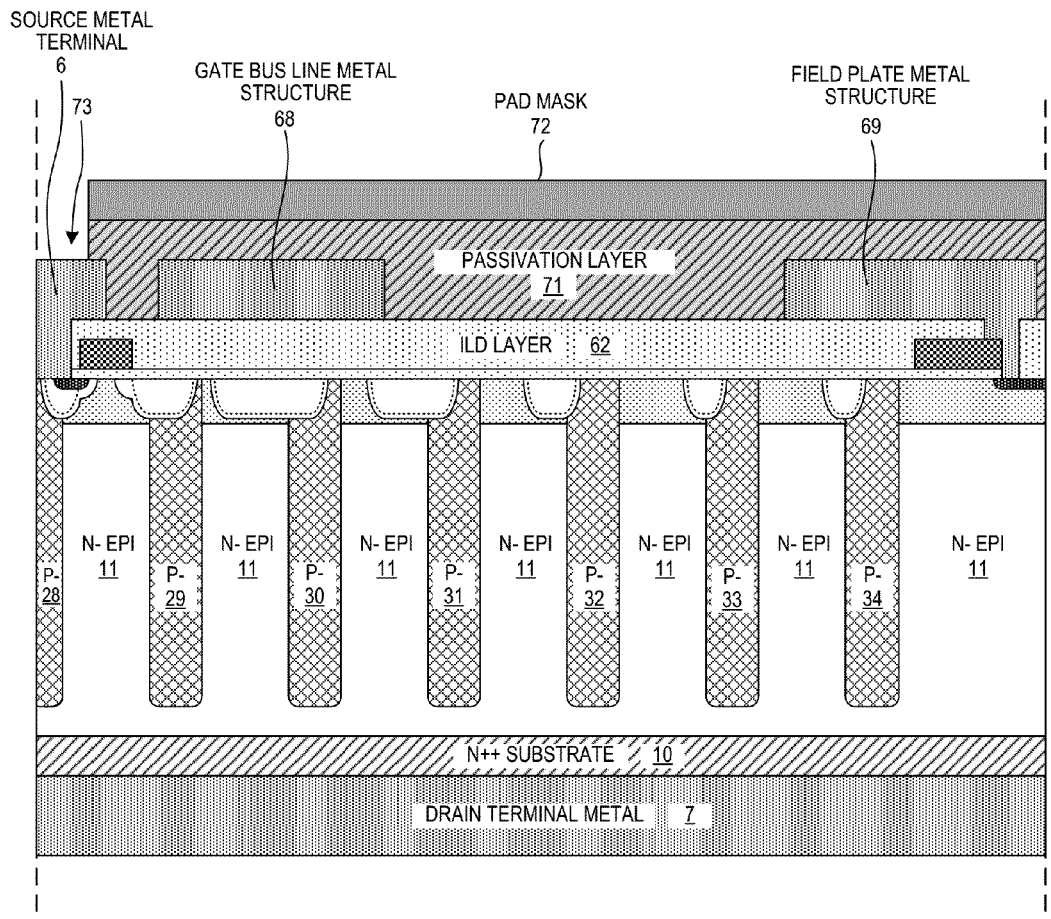
FIG. 3M illustrates a subsequent passivation formation step, pad mask step, and pad etch step.
Figure 3N:
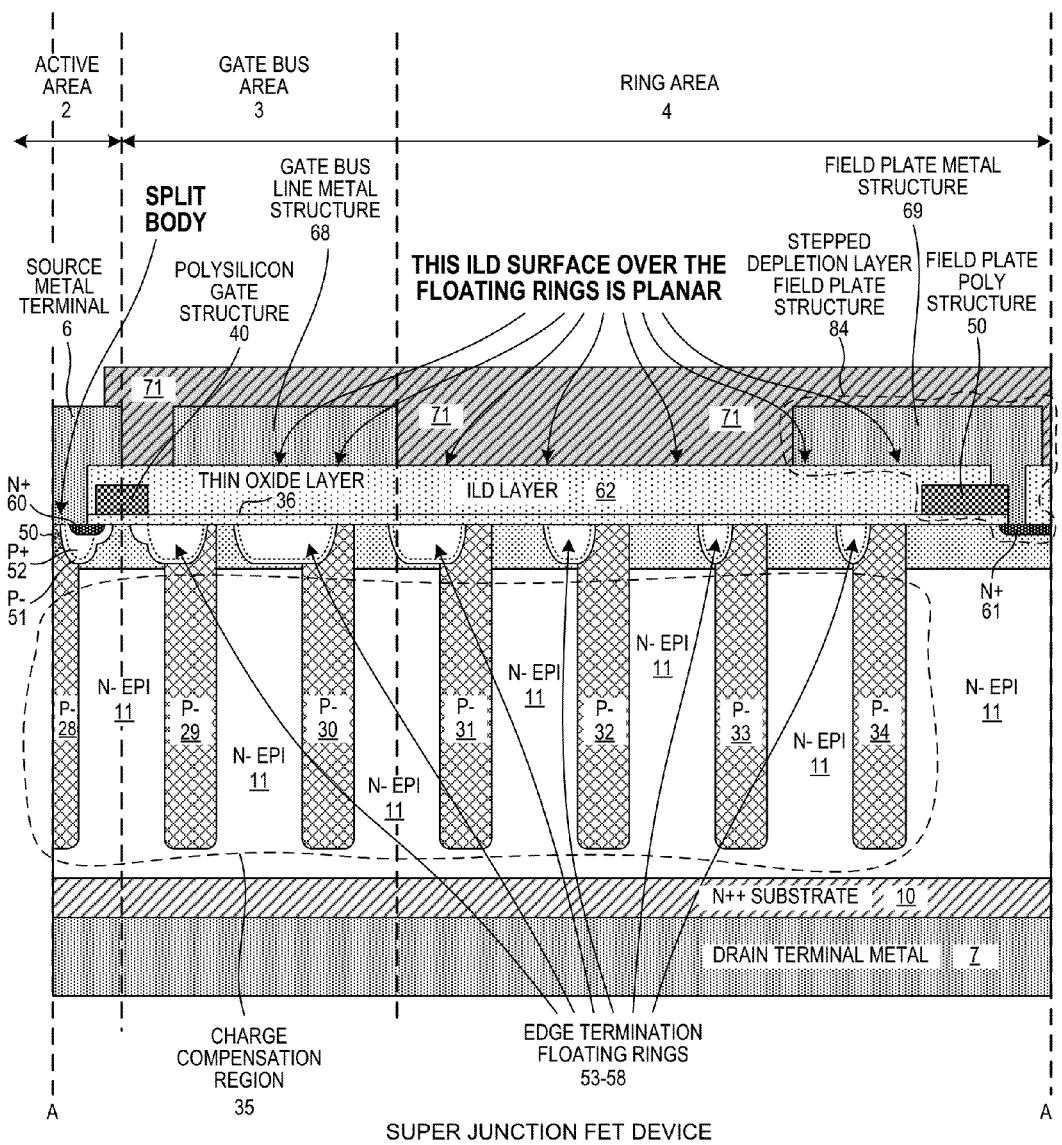
FIG. 3N is a cross-sectional diagram of a part of the final Super Junction FET device after the photoresist pad mask has been removed.

FIG. 3M illustrates a subsequent passivation and pad etch step. The metal mask 67 is removed, and the entire wafer is covered with a layer of passivation 71. In one example, the passivation is silicon nitride. A layer of photoresist is applied over the passivation layer, and the photoresist is exposed and patterned to form photoresist pad mask layer 72. This photoresist pad mask 72 is then used to etch a contact area 73 down to the top of the source metal terminal 6 and to etch a contact area (not shown) down to the top of the gate terminal 5 (see FIG. 1). A layer of drain metal is added to cover the backside of the substrate 10, thereby forming the drain metal terminal 7.

FIG. 3N is a cross-sectional diagram of a part of the final Super Junction FET device structure after the photoresist pad mask 72 of FIG. 3M has been removed. In a first novel aspect, the upper surface 63 of ILD layer 62 is planar as this layer extends from the left edge of the gate bus area 3, and over all the edge termination floating rings 55-58, and to the N++ type polysilicon feature 50. The entire upper surface of the portion of the ILD layer 62 that covers the floating rings 55-58 is planar. In a second novel aspect, the P body region of a cell of the Super Junction FET device is "split" when considered from a cross-sectional perspective, in that P-type semiconductor material in the center of each of the P– type columns extends up to the semiconductor-to-metal boundary. The charge compensation region 35 of alternating vertical P-type and N– type pillars or column structures is the drift region of the transistor between the P body regions and the N++ type substrate 10.

Figure 4:
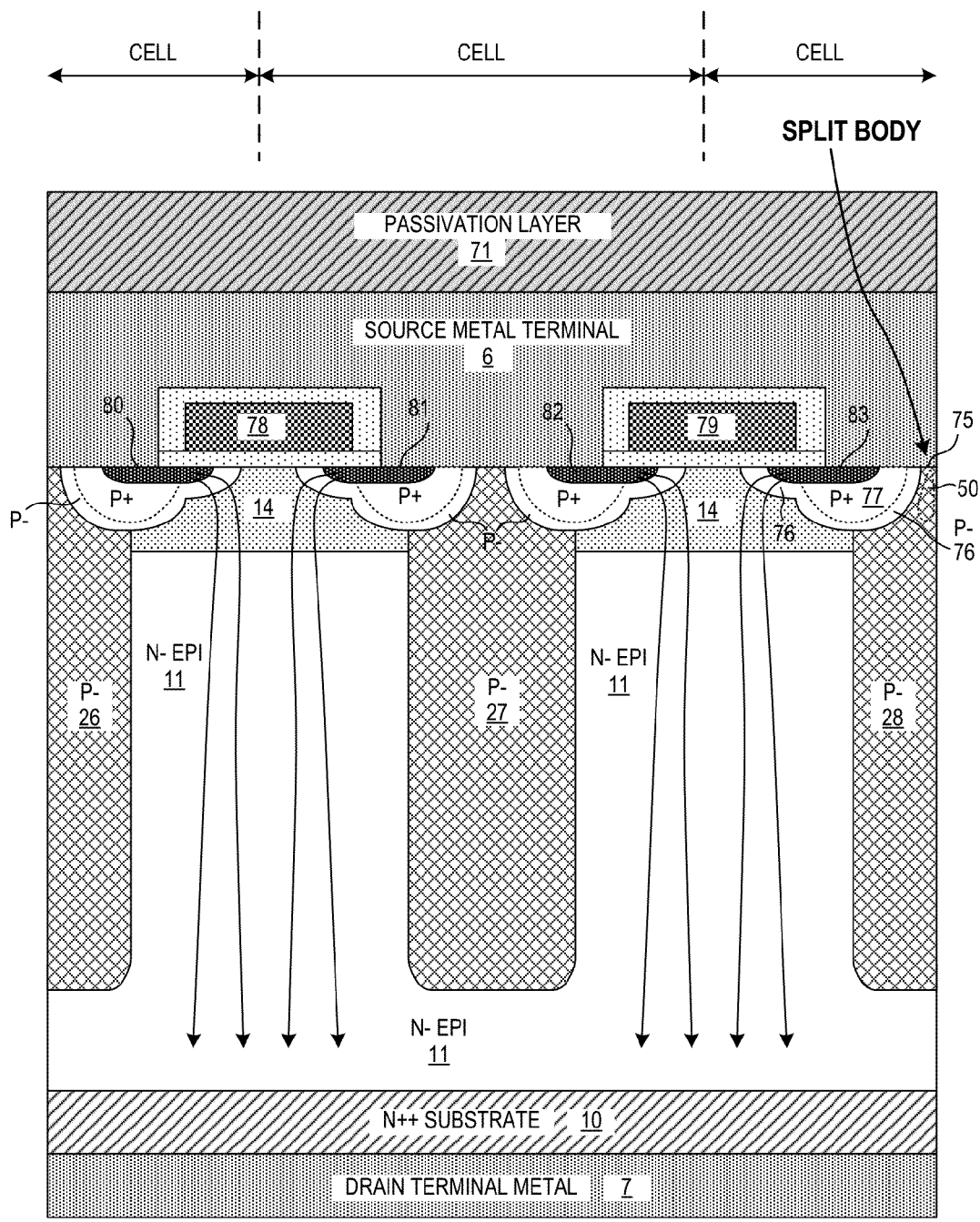
FIG. 4 shows one of multiple identical cells that make up the active area of the device. The P body of the cell is split into two parts by an intervening amount of P− type semiconductor material of the P− type column that extends up to the semiconductor-to-metal surface.

FIG. 4 shows one of multiple identical cells that make up the active area of the device. The right half of P– type column 28 is shown on the left edge of FIG. 3N, and the left half of this same P– type column 28 is shown on the right edge of FIG. 4. When considered from a cross-sectional perspective of FIG. 4, an amount of P– type semiconductor material of the each P– type column comes up to the semiconductor-to-metal boundary in the center of the P– type column. For example, an amount 50 of P– type semiconductor material in the center region of the P– type column 28 extends up to the semiconductor-to-metal boundary 75. The P body of this cell is therefore said to be "split" in the sense that P type body regions 51 and 52 on the right of the amount 50 of P– type material (see FIG. 3N) is "split" from P type body regions 76 and 77 on the left of the amount 50 of P– type material (see FIG. 4). There is a variation on P type dopant concentration at the semiconductor-to-metal boundary when traversing from the P body on one side, across the amount 50 of P– type material in the central region, and to the P body on the other side. This variation, along with the corresponding shape of the bottom of the split P body regions, is believed to improve performance of the inherent body-to-drain diode of the SJ FET in that it is believed to promote faster turn off of the inherent body-to-drain diode without increasing the forward voltage drop across the inherent diode. All of the cells of the device have this split-body structure. The JFET layer 14 helps prevent bottlenecking of the conductive path between drain and source when transistor is in on-state and current is flowing.

To turn the Super Junction JET device "on", an adequately positive voltage is placed on the gate terminal 5 (see FIG. 1) with respect to the source terminal 6. This causes a positive voltage to appear on the poly gate structures 78 and 79. The positive voltage on the poly gate causes portions of the P– type material immediately under the poly gate structures to invert such that the source and drain are electrically coupled. A negative current can then flow from the source terminal 6 (see FIG. 1), through the N+ type source regions 80-83 (see FIG. 4), through the inverted channel regions, through the N– type JFET layer region 14, and then downward through the N– type portions of the charge compensation region 35, downward through the N++ type substrate 10, and down to drain metal terminal 7 as illustrated by the arrows in FIG. 4. The arrows in FIG. 4 actually represent electron flow, so by definition the flow of positive current is in the opposite direction from the drain terminal 7 to the source terminal 6. If the positive voltage is not present on the gate terminal 5, then there are no inverted channel regions, and there is no current flow through the Super Junction FET device. The Super Junction FET device is said to be "off".

Although the present invention has been described in connection with certain specific embodiments for instructional purposes, the present invention is not limited thereto. Although one way to make a charge compensation region is outlined above, any suitable one of many different charge compensation regions and techniques for making charge compensation regions, as are known in the art, can be employed. The novel Super Junction Field Effect Transistor can be fabricated using charge compensation regions manufactured and structured as described in U.S. patent application Ser. No. 12/234,549, entitled "SuperJunction Structures For Power Devices and Methods of Manufacture", filed Sep. 19, 2008, by Lee et al. (the subject matter of which is incorporated herein by reference). For additional background information on semiconductor manufacturing processes usable to make power field effect transistors, see: U.S. patent application Ser. No. 13/113,797, entitled "Vertical Power MOSFET and IGBT Fabrication Process With Two Fewer Photomasks", filed May 23, 2011, by Kyoung Wook Seok; and U.S. patent application Ser. No. 13/413,715, entitled "Power Transistor With Increased Avalanche Current and Energy Rating", filed Mar. 7, 2012, by Kyoung Wook Seok (the subject matter of these two patent applications is incorporated herein by reference). Accordingly, various modifications, adaptations, and combinations of various features of the described embodiments can be practiced without departing from the scope of the invention as set forth in the claims.

What is claimed is:

1. A Super Junction Field Effect Transistor (FET) device, comprising:
   a substrate;
   a charge compensation region disposed above the substrate and comprising a plurality of columns of P– type semiconductor material within a region of N– type semiconductor material;
   a thin oxide layer disposed on an upper semiconductor surface;
   a plurality of edge termination floating rings, wherein each edge termination floating ring extends from the upper semiconductor surface toward the substrate;
   a polysilicon gate structure disposed on an upper surface of the thin oxide layer;
   an InterLayer Dielectric (ILD) layer disposed on an upper surface of the thin oxide layer and covering the polysilicon gate structure;
   a gate bus line metal structure disposed on an upper surface of the ILD;
   a field plate metal structure disposed at least in part on the upper surface of the ILD layer, wherein a portion of the upper surface of the ILD extends from the gate bus line metal structure to the field plate metal structure thereby extending over at least one of the edge termination floating rings, and wherein the entire portion of the upper surface of the ILD layer is substantially planar; and
   a passivation layer that covers the gate bus line metal structure and covers the field plate metal structure of metal and that covers the portion of the upper surface of the ILD.

2. The Super Junction FET device of claim 1, wherein the ILD layer comprises:
   a layer of oxide; and
   a layer of BPSG (BoroPhosphoSilicate Glass) disposed on the layer of oxide.

3. The Super Junction FET device of claim 1, wherein the ILD layer is a reflowed layer of a dielectric material.

4. The Super Junction FET device of claim 1, wherein the ILD layer comprises a reflowed layer of a dielectric material.

5. The Super Junction FET device of claim 1, wherein the ILD layer comprises a plurality of dielectric layers.

6. The Super Junction FET device of claim 1, wherein each of the columns of P– type semiconductor material has a shape taken from the group consisting of: a pillar shape, a stripe shape, and a ring shape.

7. The Super Junction FET device of claim 1, wherein the columns of the P− type semiconductor material are a concentric set of ring-shaped cylindrical columns.

8. The Super Junction FET device of claim 1, further comprising:
   a first P type body region that extends down into the P− type semiconductor material of one of the columns of the charge compensation region from the upper semiconductor surface, wherein the first P type body region comprises an inner P+ type portion and an outer P− type portion;
   a second P type body region that extends down into the P− type semiconductor material of said one column, wherein the second P type body region comprises an inner P+ type portion and an outer P− type portion;
   an amount of P− type semiconductor material disposed between the first P type body region and the second P type body region at the upper semiconductor surface; and
   a source metal terminal that contacts the first P type body region, the second P type body region, and the amount of P− type semiconductor material.

9. The Super Junction FET device of claim 1, further comprising:
   a field plate polysilicon structure disposed on the thin oxide layer; and
   a field plate diffusion region, wherein the field plate diffusion region and the field plate polysilicon structure are coupled together by the field plate metal structure so that the field plate metal structure, the field plate polysilicon structure and the field plate diffusion region together form a stepped depletion layer field plate.

10. The Super Junction FET device of claim 1, wherein each of the edge termination floating rings includes an inner P+ type portion and an outer P-type portion.

11. A Super Junction Field Effect Transistor (FET) device, comprising:
   a split-body comprising a first body region and a second body region, wherein an amount of P− type semiconductor material is disposed between the first body region and the second body region at an upper semiconductor surface;
   an amount of source metal disposed on the upper semiconductor surface and contacting the first body region, the second body region and the amount of P− type semiconductor material;
   a thin oxide layer disposed on a portion of the upper semiconductor surface;
   a plurality of edge termination floating rings;
   a polysilicon gate structure disposed on the thin oxide layer;
   an InterLayer Dielectric (ILD) layer disposed on an upper surface of the thin oxide layer and covering the polysilicon gate structure;
   a gate bus line metal structure disposed on an upper surface of the ILD layer; and
   a field plate metal structure at least a part of which is disposed on the upper surface of the ILD layer, wherein a portion of the upper surface of the ILD layer extends from the gate bus line metal structure, over the plurality of edge termination floating rings, and to the field plate metal structure, and wherein the portion of the upper surface that passes over the plurality of edge termination floating rings is substantially planar.

12. A Super Junction Field Effect Transistor (FET) device, comprising:
   a split-body comprising a first body region and a second body region, wherein an amount of P− type semiconductor material is disposed between the first body region and the second body region at an upper semiconductor surface;
   an amount of source metal disposed on the upper semiconductor surface and contacting the first body region, the second body region and the amount of P− type semiconductor material;
   a thin oxide layer disposed on a portion of the upper semiconductor surface;
   a plurality of edge termination floating rings;
   a polysilicon gate structure disposed on the thin oxide layer;
   an InterLayer Dielectric (ILD) layer disposed on an upper surface of the thin oxide layer and covering the polysilicon gate structure;
   a gate bus line metal structure disposed on an upper surface of the ILD layer; and
   a field plate metal structure at least a part of which is disposed on the upper surface of the ILD layer, wherein a portion of the upper surface of the ILD layer extends from the gate bus line metal structure, over the plurality of edge termination floating rings, and to the field plate metal structure, wherein the portion of the upper surface that passes over the plurality of edge termination floating rings is substantially planar, and wherein there is no polysilicon feature anywhere over any edge termination floating ring at any location between the gate bus line metal structure and the field plate metal structure.

13. The Super Junction FET device of claim 11, further comprising:
   a first source diffusion region extending into the first body region; and
   a second source diffusion region extending into the second body region.

14. The Super Junction FET device of claim 11, wherein the amount of P− type semiconductor material is part of a deep trench structure of a charge compensation region.

15. The Super Junction FET device of claim 11, further comprising:
   a field plate poly structure disposed on the thin oxide layer; and
   a field plate diffusion region, wherein the field plate diffusion region and the field plate polysilicon structure are coupled together by the field plate metal structure so that the field plate metal structure, the field plate polysilicon structure and the field plate diffusion region together form a stepped depletion layer field plate.

16. A method of manufacturing a Super Junction Field Effect Transistor (FET) device, comprising the steps of:
   (a) forming a charge compensation region;
   (b) forming a plurality of edge termination floating rings;
   (c) forming a thin oxide layer on an upper semiconductor surface;
   (d) forming a polysilicon gate structure on the thin oxide layer;
   (e) forming an InterLayer Dielectric (ILD) layer disposed on an upper surface of the thin oxide layer and covering the polysilicon gate structure;
   (f) forming a gate bus line metal structure on the upper surface of the ILD layer;
   (g) forming a field plate metal structure on the upper surface of the ILD layer, wherein a portion of the upper surface of the ILD layer extends from the gate bus line metal structure, over the plurality of edge termination floating rings, and to the field plate metal structure, and wherein the portion of the upper surface that passes over the plurality of edge termination floating rings is substantially planar; and (h) forming a passivation layer that covers the gate bus line metal structure and covers the field plate metal structure of metal and that covers the portion of the upper surface of the ILD, wherein the charge compensation region, the plurality of edge termination floating rings, the thin oxide layer, the polysilicon gate structure, the ILD layer, the gate bus line metal structure, the field plate metal structure, and the passivation layer are parts of the Super Junction FET device.

17. A method of manufacturing a Super Junction Field Effect Transistor (FET) device, comprising the steps of:
(a) forming a charge compensation region;
(b) forming a plurality of edge termination floating rings;
(c) forming a thin oxide layer on an upper semiconductor surface;
(d) forming a polysilicon gate structure on the thin oxide layer;
(e) forming an InterLayer Dielectric (ILD) layer disposed on an upper surface of the thin oxide layer and covering the polysilicon gate structure;
(f) forming a gate bus line metal structure on the upper surface of the ILD layer;
(g) forming a field plate metal structure on the upper surface of the ILD layer, wherein a portion of the upper surface of the ILD layer extends from the gate bus line metal structure, over the plurality of edge termination floating rings, and to the field plate metal structure, and wherein the portion of the upper surface that passes over the plurality of edge termination floating rings is substantially planar; and (h) forming a passivation layer that covers the gate bus line metal structure and covers the field plate metal structure of metal and that covers the portion of the upper surface of the ILD, wherein the charge compensation region, the plurality of edge termination floating rings, the thin oxide layer, the polysilicon gate structure, the ILD layer, the gate bus line metal structure, the field plate metal structure, and the passivation layer are parts of the Super Junction FET device, and wherein after step (g) there is no polysilicon feature anywhere over any edge termination floating ring at any location between the gate bus line metal structure and the field plate metal structure.

18. The method of manufacture of claim 16, further comprising the step of:
(i) forming a split-body including a first body portion and a second body portion, wherein an amount of semiconductor material of a deep trench structure of the charge compensation region is disposed between the first body region and the second body region at the upper semiconductor surface.

19. The method of manufacture of claim 16, further comprising the step of:
(i) forming a stepped depletion layer field plate, wherein the field plate metal structure is a part of the stepped depletion layer field plate.

* * * * *